United States Patent [19]
Bobbio

[11] Patent Number: 5,147,520
[45] Date of Patent: Sep. 15, 1992

[54] APPARATUS AND METHOD FOR CONTROLLING PROCESSING UNIFORMITY IN A MAGNETRON

[75] Inventor: Stephen M. Bobbio, Wake Forest, N.C.

[73] Assignee: MCNC, Research Triangle Park, N.C.

[21] Appl. No.: 656,790

[22] Filed: Feb. 15, 1991

[51] Int. Cl.$^5$ .............. B01J 19/12; H05H 1/46; C23F 4/04
[52] U.S. Cl. .................. 204/192.33; 204/192.32; 204/298.32; 204/298.37; 156/345; 118/723
[58] Field of Search ............ 204/192.12, 192.13, 204/192.32, 192.33, 298.03, 298.06, 298.16–298.22, 298.32, 298.34, 298.37; 156/345; 118/723; 315/111.41; 427/39

[56] References Cited

U.S. PATENT DOCUMENTS

| | | | |
|---|---|---|---|
| 4,041,353 | 8/1977 | Penfold et al. | 315/267 |
| 4,116,793 | 9/1978 | Penfold et al. | 204/192.12 |
| 4,116,794 | 9/1978 | Penfold et al. | 204/192.12 |
| 4,132,612 | 1/1979 | Penfold et al. | 204/192.12 |
| 4,132,613 | 1/1979 | Penfold et al. | 204/192.12 |
| 4,525,264 | 6/1985 | Hoffman | 204/298.22 |
| 4,581,118 | 4/1986 | Class et al. | 204/298.16 |
| 4,829,215 | 5/1989 | Kim et al. | 315/111.41 |
| 4,871,433 | 10/1989 | Wagner et al. | 204/192.12 |

*Primary Examiner*—Aaron Weisstuch
*Attorney, Agent, or Firm*—Bell, Seltzer, Park & Gibson

[57] ABSTRACT

An apparatus and method for producing a more uniform processing rate in a plasma processing magnetron. A pair of opposing spaced apart plasma barriers, preferably made of a non-magnetic material, are positioned on a substrate holder, such as an electrode for generating an electric field in the magnetron. The inner surfaces of the barriers are oriented transverse to the magnetic field of the magnetron and define a narrower spacing therebetween adjacent a predetermined portion of a substrate surface. The barriers may preferably be elongate rectangular bodies canted from parallel to each other to define a narrower spacing therebetween so that a more uniform processing rate is obtained across the entire substrate surface. The inherent non-uniformity of the magnetron may be detected by observing visual color bands appearing across a thin film on the substrate surface as it is being plasma processed. Alternatively, the plasma density may be measured at predetermined positions adjacent the substrate surface and this measured non-uniformity corrected by repositioning the barriers.

39 Claims, 4 Drawing Sheets

APPARATUS AND METHOD FOR CONTROLLING PROCESSING UNIFORMITY IN A MAGNETRON

FIELD OF THE INVENTION

This invention relates to the field of magnetron plasma processing for substrates, such as semiconductor substrates, and more particularly to an apparatus and method for producing a more uniform processing rate over the entire surface of a substrate.

BACKGROUND OF THE INVENTION

Plasma processing equipment has been developed to generate and confine a low pressure radio frequency plasma discharge for the processing of substrates, such as wafers used in integrated circuit fabrication. Processing may include a number of operations, such as reactive ion etching, plasma enhanced chemical vapor deposition, and sputtering. A magnetron uses magnetic confinement of electrons to increase the density of the plasma adjacent to a substrate surface. The processing rate in a magnetron is thereby increased by the higher overall plasma density so that acceptable levels of production may be achieved—an important concern especially for single-wafer-at-a-time processing.

The magnetron typically includes a magnetic field B generated parallel to the surface of the substrate and an electric field E generated perpendicular to the substrate by a cathode upon which the substrate is typically positioned. Electrons would rotate in closed circles around magnetic field lines in the absence of an electric field; however, since the electric field generated by the cathode tends to decelerate electrons as they approach the cathode, the final paths of the electrons are cycloidal in the E×B direction. Thus, an electron storage ring is formed around the cathode of the magnetron thereby producing a higher plasma density.

Magnetron plasma processing technology has developed so called "wings" to electrostatically confine plasma to the region adjacent the substrate surface. Wings are described, for example, in U.S. Pat. No. 4,132,613 to Penfold et al. A pair of fixed parallel wings are positioned to extend perpendicular to the magnetic field and define a region therebetween which permits the electrons influenced by the electric and magnetic fields to circulate in a closed path in the electron storage ring around a cylindrical cathode. Since the wings represent a high impedance to the plasma, only a small electron current flows to the wings. Thus, the plasma is effectively confined in the direction parallel to the magnetic field B.

Despite techniques for increasing the overall density of plasma, such as magnetic or electrostatic confinement, a magnetron may not have a uniform plasma density over the entire substrate surface to be processed. The non-uniform plasma density produces a non-uniform processing rate over the surface of the substrate. As integrated circuit manufacturing technology moves towards larger substrates and finer resolutions, this non-uniformity becomes even more critical.

Magnetrons have also been developed with remote plasma sources to increase the overall density of a plasma without increasing the energy of the ionic flux impinging the substrate. Unwanted energy causes heating, substrate ion bombardment damage, radiation damage, contamination, and loss of selectivity in etching. An example of a magnetron design having a remote plasma source is the "split cathode" magnetron described in U.S. Pat. No. 4,738,761 to Bobbio et al. and assigned to the assignee of the present invention, the disclosure of which is hereby incorporated herein by reference.

Figure 1:
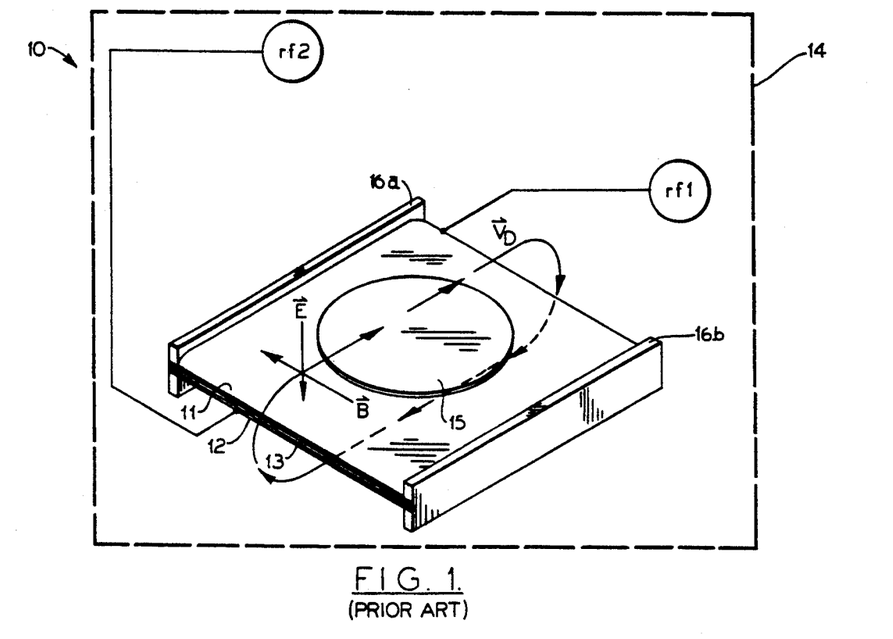
FIG. 1 is a perspective schematic view of a split cathode magnetron of the prior art.

As shown in FIG. 1, the split cathode magnetron 10 of the prior art utilizes an upper electrode 11 and a bottom electrode 12 with an insulator 13 positioned therebetween. Each electrode 11, 12 has a controllable radio frequency power input rf1, rf2. The electrodes 11, 12 are disposed within an evacuable chamber 14 for containing a reactant gas therein. The electric field E is generated in a direction into the substrate surface 15 by the action of the plasma, and the magnetic field B is generated parallel to the substrate surface by an external pair of magnets (not shown), thereby causing an electron drift velocity $V_D$ in the E×B direction. Fixed parallel wings 16a, 16b are provided on opposing sides of the substrate to electrostatically confine the plasma.

The split cathode magnetron 10 may be used with either the upper 11 or lower electrode 12 having a higher relative power. The upper electrode 11 may be higher powered when, for example, etching a material requiring a higher energy, such as a polymer. The lower electrode 12 may be higher powered when a material, such as polycrystalline silicon (polysilicon), requiring a lower energy is etched. Unfortunately, either of these relative powering configurations will result in a non-uniform processing rate over the surface of the substrate 15 to be processed. The processing rate of a substrate 15 on the upper electrode 11 will either build in the direction of the electron drift $V_D$ (top electrode higher powered) or the rate will decay in the direction of the electron drift $V_D$ (bottom electrode 12 higher powered). Other magnetrons may also experience a similar decay or buildup of the processing rate over the surface of the substrate. Moreover, increasing the overall plasma density in the region adjacent the substrate does not improve this non-uniformity of the processing rate over the surface of the substrate.

In addition to uniform processing of substrates, certain semiconductor processing applications may require that different areas of a substrate be processed at different rates. The fixed parallel wing electrostatic confinement of the prior art is unsuitable for such selective processing.

SUMMARY OF THE INVENTION

It is therefore an object of the present invention to provide a plasma confinement structure for use in a magnetron plasma processing apparatus for producing a uniform processing rate over the entire surface of a substrate.

It is another object of the present invention to provide a method for confining a plasma in a magnetron for producing a uniform processing rate over an entire substrate surface.

It is a further object of the present invention to provide a method of determining an inherent non-uniform processing rate in a magnetron and compensating for the non-uniformity.

These and other objects of the present invention are provided by a plasma confinement structure including a pair of barriers which do not have a fixed parallel spacing therebetween. The barriers may be used in a magnetron plasma processing apparatus having a magnetic field parallel to a substrate surface to be processed. For example, a pair of linear barriers may be positioned on a substrate holder at an angle from parallel to each other to produce a progressively narrower confinement of the plasma.

In particular, the plasma confinement structure includes a pair of opposing spaced apart plasma barriers. Support means, such as a substrate holder or electrode, support the barriers on opposite ends of the substrate surface. The barriers extend outwardly from the surface of the substrate. The pair of barriers have opposing inner surfaces oriented transverse to the magnetic field generated by the magnetron. These opposing inner surfaces form a narrower spacing therebetween adjacent a portion, or portions, of the substrate surface to raise the relative plasma processing rate for the corresponding substrate portions.

The plasma confinement barriers may be electrically conductive and, when placed upon a substrate supporting electrode, are maintained at the electrical potential of the electrode. The plasma barriers may also be a dielectric material, such as quartz. In either case, a ground shield may be placed around outer portions of the barriers not exposed to the plasma.

A magnetron processing apparatus produces a stagnant plasma region above the electron drift region. In the stagnant region, electrons are confined to move along magnetic field lines because the electric field is essentially zero above the electron drift region. Without wishing to be bound thereto, applicant theorizes that more narrowly confining the stagnant region increases the concentration of electrons and ionic specie therein which serves to increase the plasma processing rate along corresponding portions of the substrate surface. Therefore, the pair of barriers extend outwardly from the substrate surface a sufficient distance to laterally contain the stagnant region.

Each of the pair of plasma barriers may preferably be an elongate rectangular body. To enhance the lateral stability of the elongate rectangular body, a transverse extending portion may be included along the body, such as at an end thereof. To create a progressively narrower plasma confinement structure, the pair of rectangular bodies lying transverse to the magnetic field may be canted at an angle from parallel to each other.

In addition to linearly extending barriers, the opposing inner surfaces of the pair of barriers may be symmetrically, or asymmetrically, curved to thereby produce a desired processing rate along predetermined portions of the substrate surface. A continuous curve for the barriers may also be approximated by a series of side-by-side linearly extending segments for each of the barriers.

A magnetron plasma processing apparatus may have an inherent non-uniform processing rate producing lower and higher relative processing rates over portions of a substrate surface. The opposing inner surfaces of the plasma barriers may then be formed to have a narrower spacing therebetween adjacent the portions of the substrate subject to the lower processing rate of the magnetron to thereby produce a more uniform processing rate over the entire substrate surface. As would be readily understood by those having skill in the art, while the apparatus and method of the present invention may produce a more uniform processing rate over an entire substrate surface, the same apparatus and method may be used to produce a customized relative processing rate (higher or lower) over predetermined portions of a substrate for special processing applications.

A typical magnetron plasma processing apparatus includes an evacuable chamber and means for generating a plasma adjacent to the substrate surface to be processed. The plasma generating means typically includes a means for generating a magnetic field parallel to the substrate surface, such as an electromagnet or pair of permanent magnets. The magnetic field generating means may be positioned outside of the evacuable chamber. The combined action of a capacitively coupled electrode and the plasma itself typically provides the electric field in a direction perpendicular to the substrate surface. For a split cathode magnetron, the electric field generating means includes an upper and lower electrode adapted for predetermined relative powering. The relative powering of the electrodes is selected depending on the material to be processed.

A magnetron, such as the split cathode magnetron, may operate with an inherent processing rate which progressively decreases over the substrate surface in a direction perpendicular to the magnetic field. The opposing inner surfaces of the barriers may have a progressively narrower spacing therebetween adjacent the substrate surface to compensate for the inherent non-uniformity to thereby produce a more uniform processing rate over the entire substrate surface.

According to another aspect of the present invention, the relative processing rate along predetermined portions of a substrate surface may be controlled by providing and adjusting a pair of moveable plasma barriers having any desired shape. In particular, a pair of elongate rectangularly shaped plasma barriers may be used for confining the plasma by canting the barriers from parallel to each other to create a progressively narrower spacing therebetween. For a magnetron having an inherent progressively decreasing processing rate, the pair of barriers may be canted from parallel to each other to compensate for the inherent non-uniformity to thereby produce a more uniform processing rate over the entire substrate surface.

The inherent non-uniformity of a particular magnetron, such as caused by the higher relative powering of the upper electrode of a split cathode magnetron, may first be detected and the pair of barriers repositioned or reshaped to compensate for the non-uniformity. As would be readily understood by those having skill in the art, a non-uniformity may appear visually as a pattern of different color bands extending over a partially processed transparent thin film on the substrate surface. The barriers may be repositioned after exposing the substrate to the plasma and observing the color bands produced thereon. The repositioning and observing steps may be repeated to achieve a desired uniformity or customized processing rate over the entire substrate surface. As would be readily understood by those skilled in the art, the plasma density may also be measured using techniques known in the art, such as Langmuir probe measurements, and the plasma barriers then adjusted accordingly to achieve a more uniform or customized processing rate over the entire substrate surface.

DESCRIPTION OF THE PREFERRED EMBODIMENTS

The present invention will now be described more fully hereinafter with reference to the accompanying drawings, in which a preferred embodiment of the invention is shown. This invention may, however, be embodied in many different forms and should not be construed as limited to the embodiment set forth herein; rather, applicant provides this embodiment so that this disclosure will be thorough and complete, and will fully convey the scope of the invention to those skilled in the art. Like numbers refer to like elements throughout. The thickness of layers and regions are exaggerated for clarity.

Figure 2:
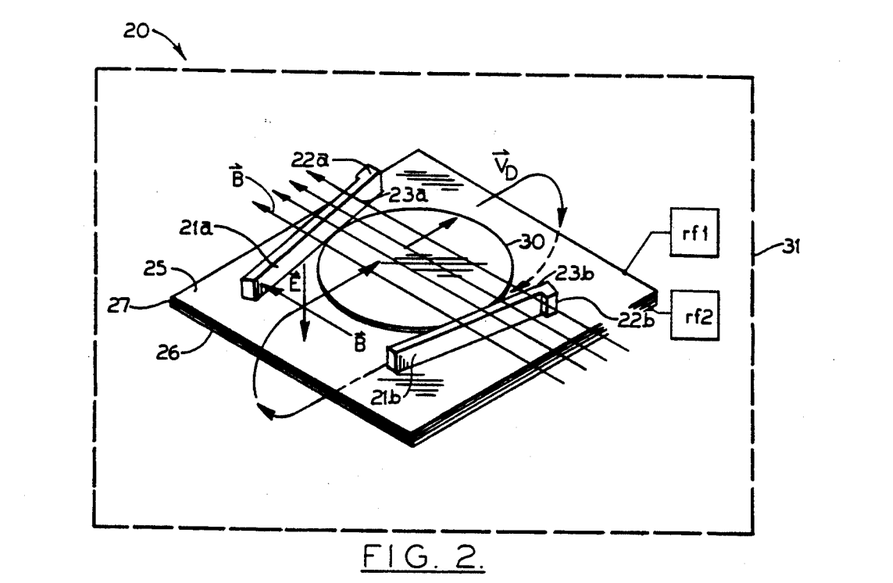
FIG. 2 is a perspective schematic view of a magnetron plasma processing apparatus according to the present invention.

Referring to FIG. 2, there is shown a magnetron plasma processing apparatus 20 according to the present invention including a pair of plasma barriers 21a, 21b for laterally confining a plasma adjacent the substrate surface 30. The barriers 21a, 21b may be positioned with a narrower spacing therebetween adjacent a predetermined portion of the substrate surface 30 to increase the plasma processing rate along that predetermined portion of the substrate.

The magnetron 20 illustrated is a split cathode magnetron having an upper electrode 25 and a lower electrode 26 with an insulator 27 positioned therebetween. The electrodes 25,26 are connected to independently controllable radio frequency power sources rf1,rf2. The electrodes 25,26 may have a predetermined relative powering depending on the substrate 30 to be processed. For example, to process a substrate requiring a lower energy, such as a polycrystalline silicon (polysilicon), the lower electrode 26 may be higher powered. To process a substrate requiring a higher energy, such as a polymer, the upper electrode 25 may be powered higher than the lower electrode 26.

The electrodes 25,26 are disposed within an evacuable chamber 31 which serves to contain a reactant gas therein. Magnetic field B generating means, such as a pair of permanent magnets or electromagnets (not shown) as are known in the art, may be disposed within or outside of the chamber 31 to create the magnetic field B parallel to the substrate surface 30 to be processed.

The upper electrode 25 of the magnetron 20 may be adapted to serve as the substrate holder. As would be readily understood by those having skill in the art, in addition to the embodiment illustrated wherein the upper electrode 25 serves as the substrate holder, the plasma barriers 21a, 21b may be positioned adjacent the substrate surface 30 by any means for supporting the barriers within the magnetron, as long as the barriers maintain the proper orientation with respect to the magnetic field and the substrate surface.

While a split cathode magnetron 20 is illustrated, the plasma barriers 21a, 21b and method of the present invention may be used for any magnetron design, especially those magnetrons exhibiting a non-uniform processing rate.

The plasma barriers 21a, 21b may preferably be rectangularly shaped elongate bodies. The rectangularly shaped bodies may preferably include a transverse portion 22a, 22b extending outwardly therefrom to increase the lateral stability of the barriers 21a, 21b when positioned on the upper electrode 25. For typical substrate sizes of 4"-6" in diameter, preferable approximate dimensions for each of the barriers 21a, 21b are 10"L × ¼"W × 1"H. The transverse extending portions 22a, 22b may be approximately 1" long and ¼ thick to add stability to the barriers. The barriers 21a, 21b may be electrically conductive and thus will remain at the electrode potential when positioned thereon. For higher electrode operating frequencies, for example 13.6 MHz, the barriers 21a, 21b may be formed of a dielectric material, such as quartz, which is inert to many reactant gases used in plasma processing. The barriers 21a, 21b are preferably formed of a non-magnetic material In either case, the barriers 21a, 21b are typically protected by a ground shield, not shown, which surrounds outer portions of the barriers not exposed to the plasma.

The pair of barriers 21a, 21b positioned on the upper electrode 25 have opposing spaced apart inner surfaces 23a, 23b which serve to confine the plasma therebetween. The inner surfaces 23a, 23b of the barriers are aligned transverse to the magnetic field B which is parallel to and extends across the substrate surface 30. The barriers 21a, 21b may be positioned so that they are canted from parallel to each other to thereby define a narrower spacing therebetween. The narrower spacing serves to raise the processing rate along corresponding portions of the substrate surface 30. As would be readily understood by those having skill in the art, although the plasma barriers 21a, 21b are shown equally canted (FIG. 2), one barrier may be aligned perpendicular to the magnetic field B and the opposite barrier offset from perpendicular alignment from the magnetic field B to create the narrower spacing at an end of the barriers 21a, 21b.

The theorized operation of the plasma barriers 21a, 21b may be explained by reference to FIGS. 3A and 3B. While applicant does not wish to be bound by the theory disclosed, it is the theorized that the inner surfaces 23a, 23b of the barriers increase the processing rate by confining the electrons and ions in the stagnant region 35. As would be readily understood by those having skill in the art, the stagnant region 35 occurs above the electron drift region 37 and the plasma sheath 36. Typically the plasma sheath 36 and the electron drift region 37 together extend approximately 2 mm above the surface of the substrate 30. The stagnant region 35 may also typically extend about 2 mm above the electron drift region 37. Where the barrier inner surfaces 23a, 23b define a narrower spacing, a greater density of these electrons and ions is created in the stagnant region 35.

Figures 3A, 3B:
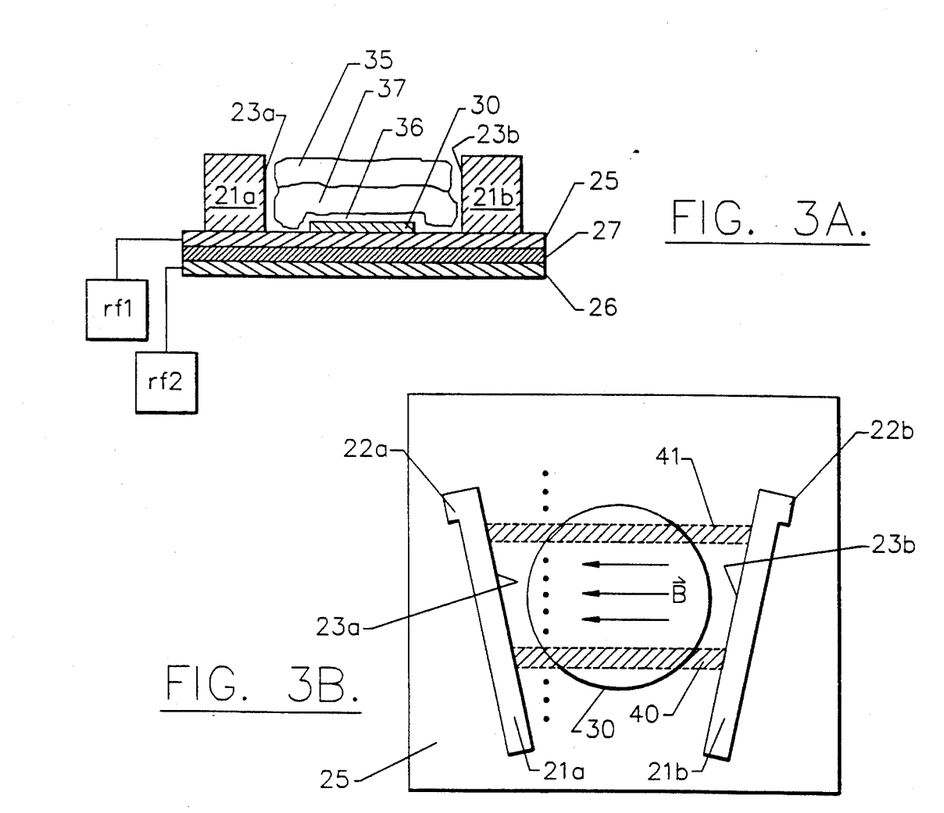
FIG. 3A is a side cross-sectional view of a portion of the magnetron as shown in FIG. 2.
FIG. 3B is a plan view of a portion of the magnetron as shown in FIG. 2.

FIG. 3B shows two representative "cells" 40,41 of the stagnant region 35. As would be readily understood by those having skill in the art, the stagnant region 35 may be considered as consisting of a series of side-by-side cells, each having a width related to the mean free electron path. Since the electric field E is typically near zero in the stagnant region 35, the motion of the electrons is governed by the magnetic field B which allows the electrons to move only in the magnetic field B direction. Since the electrons may not move perpendicular to the magnetic field B, the electron density is equilibrated separately in each cell across the substrate surface 30. Therefore, a greater density of electrons and ions is created where the barrier inner surfaces 23a, 23b define a narrower spacing therebetween, such as the cell designated 40 as compared to the cell designated 41.

Figure 3C:
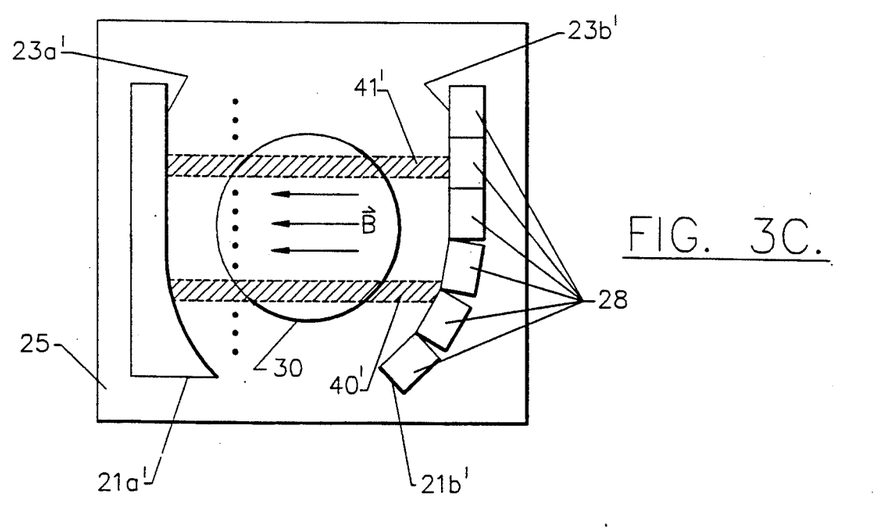
FIG. 3C is a plan view of a portion of a magnetron according to the present invention.

FIG. 3C illustrates an alternate embodiment of the plasma barriers 21a', 21b' according to the present invention. The inner opposing surfaces 23', 23b' of the plasma barriers 21a', 21b' are symmetrically curved to provide a more uniform processing rate. Asymmetrically curved inner surfaces, not shown, may also be used. It has been found that for some processing applications, particularly for a substrate having a 4" diameter, the linear barriers 21a, 21b as shown in FIG. 3B, for example, provide an adequate uniformity correction. For 6" diameter substrates and larger, curved barriers may provide better uniformity of the processing rate. As would be readily understood by those having skill in the art, a piece-wise linear barrier 21b' comprising a plurality of individual rectangularly shaped pieces 28 may be used to approximate a curved inner surface 23b'. As would also be readily understood by those having skill in the art, a linear barrier and a curved barrier may be used together in combination.

The plasma barriers 21a, 21b according to the present invention may be used to raise the relative plasma processing rate for predetermined portions of the substrate surface 30. Raising the relative processing rate is highly desirable when the magnetron has a non-uniform processing rate over a substrate surface 30. The plasma barriers 21a, 21b may be used to make the processing rate uniform over the entire substrate surface 30. As would be readily understood by those having skill in the art, a non-uniform processing rate may also be created by the barriers 21a, 21b for certain applications.

Figure 4A:
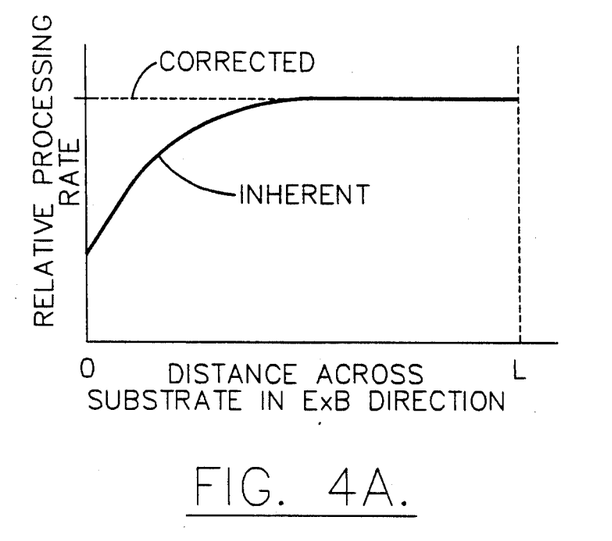
FIG. 4A is a graph of a relative processing rate for a magnetron plasma processing apparatus according to the present invention.
Figure 4B:
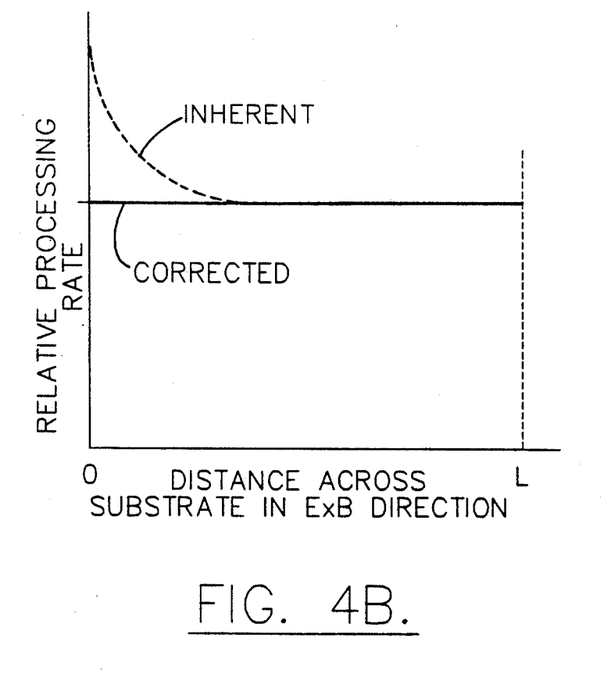
FIG. 4B is a graph of a relative processing rate for another magnetron plasma processing apparatus according to the present invention.

The split cathode magnetron as illustrated may be operated with either the upper electrode 25 or lower electrode 26 having a higher relative power. When etching a polymer, for example, the upper electrode 25 is higher powered resulting in a theoretical processing rate "profile" over the substrate surface having a length L as shown in FIG. 4A. As shown, the processing rate progressively increases along the substrate surface in the E×B direction. When etching polysilicon, which requires a lower energy, the lower electrode 26 may be higher powered resulting in a theoretical processing rate profile as shown in FIG. 4B. In this configuration, the processing rate progressively decreases over the surface of the substrate in the E×B direction. In either relative powering configuration, the uniformity of the plasma processing may be greatly enhanced by proper positioning of the plasma barriers 21a, 21b and the theoretical corrected processing rates are represented by the flat lines as shown.

Figure 5:
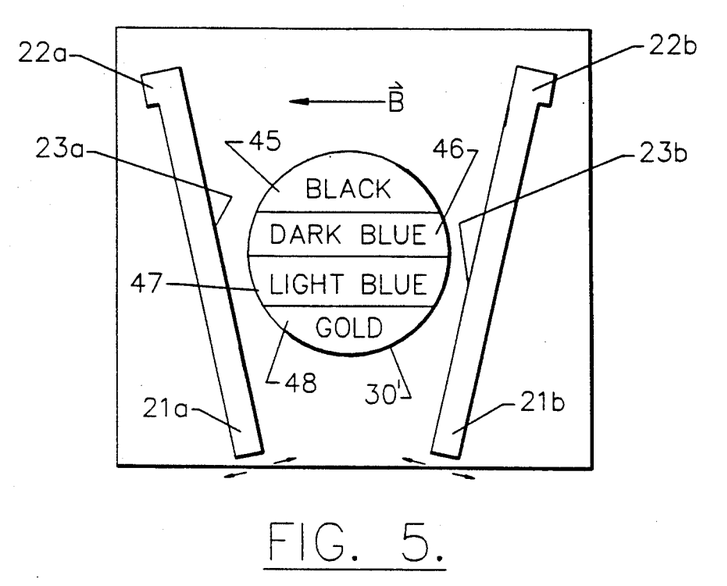
FIG. 5 is a plan view of a portion of the magnetron as shown in FIG. 2 with a substrate having a non-uniformly partially processed surface.

FIG. 5 illustrates a silicon substrate 30', having a thin oxide layer thereon, after exposure to a non-uniform plasma processing etch. Visible bands of color 45-48 appear across the surface of the substrate 30'. The boundaries between the color bands 45-48 lie parallel to the magnetic field B. As would be readily understood by those having skill in the art, the bands 45-48 are created by the interference of light reflected from the surface of the thin oxide film and the surface of the underlying silicon substrate.

The black color band 45 indicates the least depth of oxide or, correspondingly, the highest processing rate. The gold color band 48 indicates the thickest oxide layer. The color of each band is dependent on the thickness of the oxide layer and the depth of the oxide is directly related to the relative plasma processing rate. If the substrate 30' were being processed uniformly, an observer would see the entire substrate surface progress in color from gold, to light blue, to dark blue, to black, and then to the color of the silicon substrate as the entire oxide layer is removed.

A method for obtaining more uniform processing of an entire substrate surface, according to the present invention, requires that a substrate surface be partially processed to determine the existence of color bands 45-48 as described above. However, the plasma barriers 21a, 21b may be initially positioned, prior to any plasma processing, based on the operator's prior experience with the particular magnetron. Thus, if it is known that a split cathode magnetron with an upper electrode 25 having a higher power is being used, the operator may first position the barriers 21a, 21b accordingly.

The appearance of the color bands 45-48 indicates that the processing rate of the magnetron is non-uniform. The plasma barriers 21a, 21b may then be repositioned and the appearance and movement of the color bands 45-48 observed again so as to determine whether further adjustment of the plasma barriers 21a, 21b is necessary. The barriers 21a, 21b may be repositioned any number of times until the desired uniformity is achieved. While the barriers 21a, 21b are typically positioned so as to rest upon the horizontal planar member, the barriers may be secured by any other means, such as would be readily understood by those having skill in the art. For example the barriers 21a, 21b could be pivotally connected to the planar member or be secured with readily removable fasteners or adhesive.

It has been found that typically no more than three positioning steps, including the initial positioning, are required to achieve acceptable uniformity for the split cathode magnetron. The non-uniformity typically progresses from 5% with an estimated initial positioning, to 2% with a second positioning, and 1.8% with the third positioning. Less than 2% non-uniformity is generally acceptable for most plasma processing applications.

A test substrate may also be used first to obtain proper alignment of the plasma barriers 21a, 21b. Then the substrate to be processed may be substituted for the test substrate.

Figure 6:
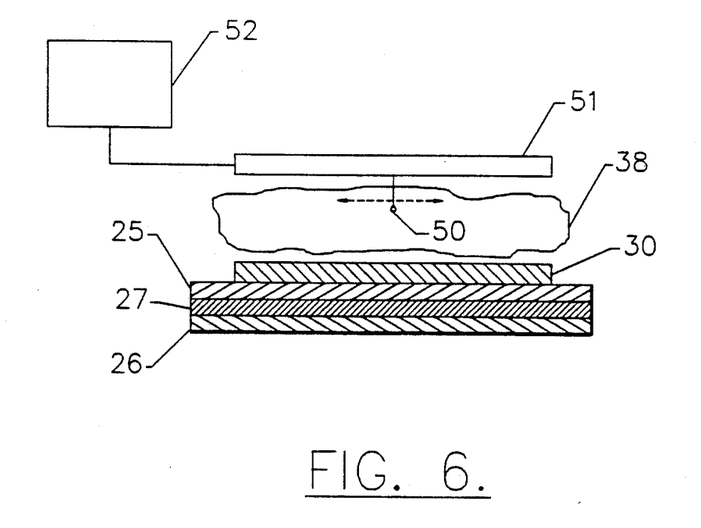
FIG. 6 is a cross-sectional side elevational view of a portion of a magnetron plasma processing apparatus according to the present invention.

An alternative to the visual observation step described above, is to measure the plasma density at a series of positions adjacent the substrate 30. As shown in FIG. 6, a plasma probe 50 may be positioned in the plasma 38 by support means 51. The plasma probe 50 may be a Langmuir probe as would be readily understood by those having skill in the art. An array of plasma probes, not shown, may also be positioned to measure the plasma density adjacent the substrate surface. The plasma density may preferably be measured approximately every 1 cm. The measured plasma density may be indicated on a display means 52. The plasma barriers 21a, 21b may then be repositioned until the desired uniformity, as measured, is achieved.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

That which is claimed is:

1. A plasma confinement structure adapted for use in a magnetron plasma processing apparatus having a magnetic field parallel to a substrate surface to be processed, said plasma confinement structure comprising:
    a pair of opposing spaced apart electrostatic plasma confinement barriers formed of a nonmagnetic material; and
    means for supporting each of said pair of barriers adjacent opposite ends of the substrate and extending outwardly from the substrate surface;
    said pair of barriers having opposing inner surfaces being oriented transverse to the magnetic field, said opposing inner surfaces forming a narrower spacing therebetween adjacent a predetermined portion of the substrate surface so as to electrostatically confine the plasma and thereby raise the relative plasma processing rate for the predetermined portion of the substrate surface independent of the magnetic field.

2. The plasma confinement structure of claim 1 wherein each of said pair of barriers comprises an elongate rectangular body, and wherein each of said pair of rectangular bodies are canted from parallel to each other.

3. The plasma confinement structure of claim 2 wherein each of said barriers further comprises a transverse extending portion for increasing the lateral stability of each of said barriers.

4. The plasma confinement structure of claim 1 wherein said opposing inner surfaces of said pair of barriers are symmetrically curved.

5. The plasma confinement structure of claim 1 wherein said magnetron processing apparatus is adapted for producing a plasma having a stagnant region adjacent an electron drift region, and wherein said inner surfaces of said pair of barriers extend outwardly from the substrate surface a sufficient distance to laterally contain the stagnant region.

6. The plasma confinement structure of claim 1 wherein each of said pair of barriers is dielectric.

7. The plasma confinement structure of claim 1 wherein said barrier support means comprises a flat plate cathode adapted for positioning of the substrate thereon.

8. The plasma confinement structure of claim 7 wherein each of said pair of barriers is electrically conductive, and wherein each of said pair of barriers is electrically connected to said cathode.

9. The plasma confinement structure of claim 1 wherein the magnetron plasma processing apparatus has an inherent non-uniform processing rate producing lower and higher relative processing rates over portions of the substrate surface, and wherein said opposing inner surfaces of said barriers have a narrower spacing therebetween adjacent the portions of the substrate subject to the lower processing rate of the magnetron to thereby produce a more uniform processing rate for the entire substrate surface.

10. The plasma confinement structure of claim 1 wherein the magnetron plasma processing apparatus has an inherent processing rate progressively increasing across the substrate surface from a first end to a second end thereof in a direction perpendicular to the magnetic field, and wherein said opposing inner surfaces of said barriers have a progressively narrower spacing therebetween adjacent the substrate surface extending from the second end of the substrate surface to the first end thereof to thereby produce a more uniform processing rate over the entire substrate surface.

11. An apparatus for plasma processing a substrate surface, comprising:
    an evacuable chamber;
    means for generating a plasma in said evacuable chamber and adjacent the substrate surface, said plasma generating means comprising:
        means for generating a magnetic field parallel to the substrate surface;
        a first and second electrode having an insulator positioned therebetween, said first electrode adapted for holding the substrate thereon, said first and second electrodes for generating an electric field perpendicular to the substrate surface, said first and second electrodes adapted for predetermined relative powering; and
        a pair of opposing spaced apart electrostatic plasma confinement barriers positioned adjacent said first electrode and extending outwardly therefrom, said pair of barriers formed of a nonmagnetic material, said pair of barriers having opposing inner surfaces being oriented transverse to the magnetic field, said opposing inner surfaces forming a narrower spacing therebetween adjacent a predetermined portion of the substrate surface so as to electrostatically confine the plasma and thereby raise the relative plasma processing rate for the predetermined portion of the substrate surface independent of the magnetic field.

12. The apparatus of claim 11 wherein each of said pair of barriers comprises an elongate rectangular body, and wherein each of said pair of rectangular bodies are canted from parallel to each other.

13. The apparatus of claim 12 wherein each of said barriers further comprises a transverse extending portion for increasing the lateral stability of each of said barriers.

14. The apparatus of claim 11 wherein said opposing inner surfaces of said pair of barriers are symmetrically curved.

15. The apparatus of claim 11 wherein said plasma generating means is adapted for producing a plasma having a stagnant region adjacent an electron drift region, and wherein said inner surfaces of said pair of barriers extend outwardly from said first electrode a sufficient distance to laterally contain the stagnant region.

16. The apparatus of claim 11 wherein each of said pair of barriers is electrically conductive and wherein each of said pair of barriers is electrically connected to said first electrode.

17. The apparatus of claim 11 wherein each of said pair of barriers is dielectric.

18. The apparatus of claim 11 further comprising means for measuring the plasma density at predetermined locations adjacent the substrate surface.

19. The apparatus of claim 11 wherein said plasma generating means has an inherent non-uniform processing rate with lower and higher relative processing rates over portions of the substrate surface, and wherein said opposing inner surfaces of said barriers have a narrower spacing therebetween adjacent the portions of the substrate subject to the lower processing rate of said plasma generating means to thereby produce a more uniform processing rate for the entire substrate surface.

20. The apparatus of claim 11 wherein said plasma generating means has an inherent processing rate progressively increasing over the substrate surface from a first end to a second end thereof in a direction perpendicular to the magnetic field, and wherein said opposing inner surfaces of said barriers have a progressively narrower spacing therebetween adjacent the substrate surface extending from the second end of the substrate surface to the first end thereof to thereby produce a more uniform processing rate for the entire substrate surface.

21. An apparatus for plasma processing a substrate surface, comprising:
an evacuable chamber;
means for generating a plasma in said evacuable chamber and adjacent the substrate surface, said plasma generating means including means for generating a magnetic field parallel to the substrate surface; and
a pair of opposing spaced apart electrostatic plasma confinement barriers positioned adjacent said first electrode and extending outwardly therefrom, said pair of barriers formed of a nonmagnetic material, said pair of barriers having opposing inner surfaces being oriented transverse to the magnetic field, said opposing inner surfaces forming a narrower spacing therebetween adjacent a predetermined portion of the substrate surface so as to electrostatically confine the plasma and thereby raise the relative plasma processing rate for the predetermined portion of the substrate surface independent of the magnetic field.

22. The apparatus of claim 21 wherein each of said pair of barriers comprises an elongate rectangular body, and wherein each of said pair of rectangular bodies are canted from parallel to each other.

23. The apparatus of claim 22 wherein each of said barriers further comprises a transverse extending portion for increasing the lateral stability of each of said barriers.

24. The apparatus of claim 21 wherein said opposing inner surfaces of said pair of barriers are symmetrically curved.

25. The apparatus of claim 21 wherein said plasma generating means is adapted for producing a plasma having a stagnant region adjacent an electron drift region, and wherein said inner surfaces of said pair of barriers extend outwardly from said substrate holder a sufficient distance to laterally contain the stagnant region.

26. The apparatus of claim 21 wherein said substrate holder comprises a flat plate cathode for generating an electric field perpendicular to the substrate surface.

27. The apparatus of claim 26 wherein each of said pair of barriers is electrically conductive and wherein each of said pair of barriers is electrically connected to said flat plate cathode.

28. The apparatus of claim 21 wherein each of said pair of barriers is dielectric.

29. The apparatus of claim 21 wherein said plasma generating means has an inherent non-uniform processing rate producing lower and higher relative processing rates over portions of the substrate surface, and wherein said opposing inner surfaces of said barriers have a narrower spacing therebetween adjacent the portions of the substrate subject to the lower processing rate of said plasma generating means to thereby produce a more uniform processing rate for the entire substrate surface.

30. The apparatus of claim 21 wherein said plasma generating means has an inherent processing rate progressively increasing over the substrate surface from a first end to a second end thereof in a direction perpendicular to the magnetic field, and wherein said opposing inner surfaces of said barriers have a progressively narrower spacing therebetween adjacent the substrate surface extending from the second end of the substrate surface to the first end thereof to thereby produce a more uniform processing rate for the entire substrate surface.

31. The apparatus of claim 21 further comprising means for measuring the plasma density at predetermined locations adjacent the substrate surface.

32. A method for raising a relative processing rate for a portion of a substrate surface in a magnetron plasma processing apparatus, the magnetron having a magnetic field parallel to the substrate surface, said method comprising the steps of:
generating a plasma adjacent the substrate surface, the magnetic field confining the plasma adjacent the substrate surface; and
more narrowly electrostatically confining the plasma, in a lateral direction transverse to the magnetic field, adjacent a predetermined portion of the substrate surface so as to electrostatically confine the plasma and thereby raise the relative plasma processing rate for the predetermined portion of the substrate surface independent of the magnetic field.

33. The method of claim 32 wherein said step of generating the plasma comprises generating a plasma having a stagnant region adjacent an electron drift region, and wherein said step of confining the plasma comprises confining the plasma in the stagnant region.

34. The method of claim 32 wherein said step of confining the plasma comprises the steps of:
providing a pair of plasma barriers; and
positioning the pair of barriers adjacent the substrate surface in an opposing spaced apart relation so that the inner surfaces of the barriers are transverse to the magnetic field and form a narrower spacing therebetween adjacent the predetermined portion of the substrate surface.

35. The method of claim 34 wherein said step of confining the plasma comprises the steps of:
providing a pair of elongate rectangular plasma barriers; and
positioning the pair of barriers in an opposing spaced apart relation and canted from parallel to each other.

36. The method of claim 34 further comprising the steps of:
detecting an inherent non-uniformity of the magnetron plasma processing apparatus; and
repositioning the pair of plasma barriers to correct for the non-uniformity.

37. The method of claim 36 wherein said detecting step comprises the steps of:

partially plasma processing a thin film on the substrate surface; and observing visible color bands caused by interference light produced by light reflected from the partially processed thin film surface and reflected from the surface of the substrate.

38. The method of claim 36 wherein said detecting step comprises measuring the plasma density adjacent the substrate surface.

39. The method of claim 36 further comprising repeating said detecting and said repositioning steps to achieve a desired uniformity over the entire substrate surface.

* * * * *

UNITED STATES PATENT AND TRADEMARK OFFICE
CERTIFICATE OF CORRECTION

PATENT NO.   :   5,147,520
DATED        :   September 15, 1992
INVENTOR(S)  :   Stephen M. Bobbio It is certified that error appears in the above-identified patent and that said Letters Patent is hereby corrected as shown below:

Column 6, line 19, after "1/4" insert -- " --.

Column 6, line 28, after "material" insert a period.

Column 7, line 16, delete "23'" and substitute therefor --23a'--.

Signed and Sealed this

Twenty-first Day of September, 1993

Attest:

BRUCE LEHMAN

*Attesting Officer*        *Commissioner of Patents and Trademarks*